US006563740B2

(12) United States Patent
Thomsen et al.

(10) Patent No.: US 6,563,740 B2
(45) Date of Patent: May 13, 2003

(54) ELECTRONIC CIRCUIT AND METHOD FOR TESTING AND REFRESHING NON-VOLATILE MEMORY

(75) Inventors: Joseph A. Thomsen, Gilbert, AZ (US); Mitchel Obolsky, Phoenix, AZ (US); Joseph W. Triece, Phoenix, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 09/951,280

(22) Filed: Sep. 13, 2001

(65) Prior Publication Data

US 2003/0048665 A1 Mar. 13, 2003

(51) Int. Cl.[7] .............................................. G11C 11/34
(52) U.S. Cl. ................... 365/185.25; 365/222
(58) Field of Search ............................. 365/185.25, 222

(56) References Cited

U.S. PATENT DOCUMENTS 5,828,607 A * 10/1998 Bushey et al. ......... 365/189.11
5,852,582 A * 12/1998 Cleveland et al. .......... 365/222

* cited by examiner

Primary Examiner—M. Tran
(74) Attorney, Agent, or Firm—Baker Botts L.L.P.

(57) ABSTRACT

An electronic circuit includes a non-volatile memory on an integrated circuit that has several memory cells. The cells each have a voltage state and a gate. A gate bias circuit on the integrated circuit is coupled to the gates of the memory cells. The gate bias circuit includes at least a read voltage and a margin voltage. A detection circuit on the integrated circuit is coupled to the cells. The detection circuit includes a comparator and a reference voltage. The reference voltage and the voltage state of one of the cells are coupled to the comparator. The detection circuit includes an output generating a signal corresponding to the comparator output. The integrated circuit includes a monitor circuit. The monitor circuit is coupled to the output of the detection circuit and determines whether the voltage state of the cell transitions between application of the read and margin voltages to the gate.

23 Claims, 5 Drawing Sheets

ELECTRONIC CIRCUIT AND METHOD FOR TESTING AND REFRESHING NON-VOLATILE MEMORY

BACKGROUND OF THE INVENTION

The invention relates to electronic devices and, more particularly, to an electronic circuit and method for testing and refreshing non-volatile memory.

DESCRIPTION OF THE RELATED TECHNOLOGY

Electronic devices are often identically manufactured in large numbers in order to decrease their average cost. The resulting devices may be intended for different uses. In addition the manufacturing process may result in some variation in the parameters of devices. In both of those cases, non-volatile memory can be used to store information that differentiates the devices.

When electronic devices that are manufactured in an identical manner are intended for use in different applications, functionality may be built into the devices that is triggered by the presence or absence of data in non-volatile memory. In a simple example, an electronic device may be used in one of two products. A single non-volatile bit is programmed with either a high or low voltage. A high voltage would enable functionality appropriate to the first product, while a low voltage would enable functionality appropriate for the second product. A greater amount of non-volatile memory would allow for greater diversity of function.

When electronic devices that are manufactured in an identical manner are intended for use in the same application, non-volatile memory may still be useful for storing data that calibrates the device. For example, a particular manufacturing process could result in variations in electrical parameters. A circuit could be included in the electronic device that modifies those parameters in accordance to the data in a non-volatile memory. A post-manufacture test could be performed to indicate the electrical parameter for a particular device. The non-volatile memory could then be programmed so that the modification circuit corrects any deviation from the desired value of the electrical parameter. Non-volatile memory is also useful for other tasks in electronic devices as is known to those of skill in the art. Non-volatile memory circuits and methods of using non-volatile memory have utility in the electronic device industry.

Non-volatile memory retains a state representing data in the absence of power. Under some circumstances or over a sufficient length of time, the data-representing states can be lost. For example, non-volatile memory can be implemented by trapping charge on an isolated node to represent a certain data state. The presence of the charge affects an electrical characteristic of a circuit containing the node. If the charge dissipates, the characteristic changes and the data will not be read correctly. Incorrectly read data can detrimentally affect the calibration or function identification that the non-volatile memory was included to achieve.

SUMMARY OF THE INVENTION

The present invention is directed to an electronic circuit with non-volatile memory, a method for refreshing the non-volatile memory, and systems employing the circuit or method.

In one embodiment of the electronic circuit with non-volatile memory of the present invention, the non-volatile memory is located on an integrated circuit and includes several memory cells each of which has a voltage state as data and a gate. The integrated circuit also includes a gate bias circuit that is coupled to the gates of the memory cells. The gate bias circuit includes at least a read voltage and a margin voltage. A detection circuit on the integrated circuit is coupled to the cells. The detection circuit includes a comparator and a reference voltage. The reference voltage and the voltage state of one of the cells are coupled to the comparator. The detection circuit includes an output generating a signal corresponding to the comparator output. The integrated circuit also includes a monitor circuit. The monitor circuit is coupled to the output of the detection circuit and determines whether the voltage state of the cell transitions between application of the read and margin voltages to the gate.

In a more specific embodiment of the present invention, the non-volatile memory is programmable. In another more specific embodiment of the invention, integrated circuit includes a programming circuit that programs cells that the monitor circuit determines are transitioning between application of the read and margin voltages to the gate. In another more specific embodiment of the invention, the monitor circuit includes a checksum circuit. The checksum circuit allows the monitor circuit to compare cells in groups by calculating the checksum of the cell voltage states when the read voltage is applied and when the margin voltage is applied. All the cells in the memory can be included in a single checksum test. In another more specific embodiment of the invention, the non-volatile memory also includes another plurality of cells that are not attached to the bias circuit or the detection circuit.

In a different embodiment of the electronic circuit with non-volatile memory of the present invention. The cells are connected to both a detection circuit and a margin circuit. The detection circuit compares cell voltage states to a reference voltage and the margin circuit compares them to a margin voltage. A monitor circuit determines whether the voltage states of any of the cells is between the reference voltage and the margin voltage.

In a method embodiment of the present invention, a read voltage is applied to the gate of a cell of a non-volatile memory. The voltage state of that cell is then compared to a reference voltage to determine a first result. A margin voltage is applied to the gate of the cell. The voltage state of that cell is then compared to the reference voltage to determine a second result. The first and second results are compared and a signal is produced if they differ.

In a more specific method embodiment of the invention, the margin voltage is applied to the cell before the read voltage is applied. In another more specific method embodiment of the invention, first and second results for a plurality of cells are stored. Two checksums are then calculated: one for the first results and one for the second results. The step of comparing the first result to the second result is then accomplished by comparing the checksums.

A feature of the invention is monitoring the voltage states of cells in non-volatile memory in an electronic circuit.

Another feature is storing data in an electronic circuit.

Another feature is monitoring data integrity in an electronic circuit.

An advantage of the present invention is detecting degradation of data in non-volatile memory.

Another advantage is accurately maintained data and reprogramming of data values that are approaching transition.

Still another advantage is reduced need for separate test circuits.

Another advantage is software selection of margin voltage.

Another advantage is flexible grouping of memory cells for testing.

Other and further features and advantages will be apparent from the following description of presently preferred embodiments of the invention, given for the purpose of disclosure and taken in conjunction with the accompanying drawings. Not all embodiments of the invention will include all the specified advantages. For example, one embodiment may only monitor the voltage states of cells in non-volatile memory in an electronic circuit, while another reprograms data values that are approaching transition.

DETAILED DESCRIPTION OF THE PREFERRED EMBODIMENTS

Figure 1:
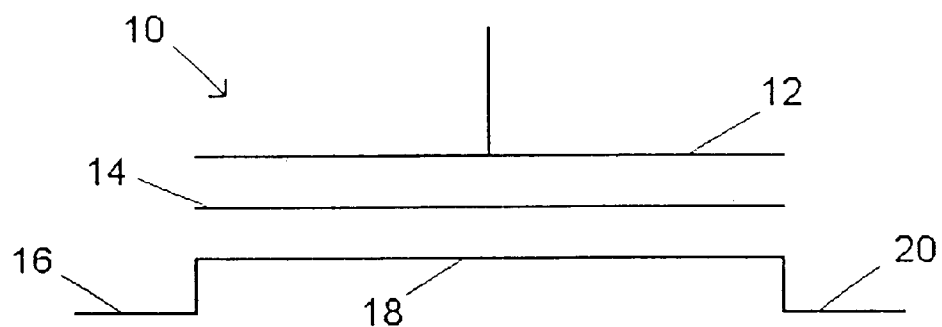
FIG. 1 is a schematic representation of a non-volatile memory cell in accordance with one embodiment of the present invention.

Referring now to the drawings, the details of preferred embodiments of the invention are schematically illustrated. Like elements in the drawings will be represented by like numbers, and similar elements will be represented by like numbers with a different lower case letter suffix.

Referring to FIG. 1, a schematic representation of a non-volatile memory cell is depicted. The cell 10 includes a control gate 12, a floating gate 14, a source 16, a channel region 18, and a drain 20. The control gate 12 is often referred to as just the gate. The cell 10 has a voltage state that is dependent upon the charge stored on the floating gate 14. The voltage state of the cell 10 is determined by applying voltages to the gate 12 and the source 16, while measuring the resulting voltage, if any, on the drain 20. When the data in the cell 10 is read, a read voltage is applied to the gate 12 and a ground voltage is applied to the source. The cell can be programmed by changing the amount of charge on the floating gate 14. The floating gate 14 charge is changed by placing a programming voltage on the gate 12. The programming voltage is generally farther from ground than the read voltage.

Figure 2:
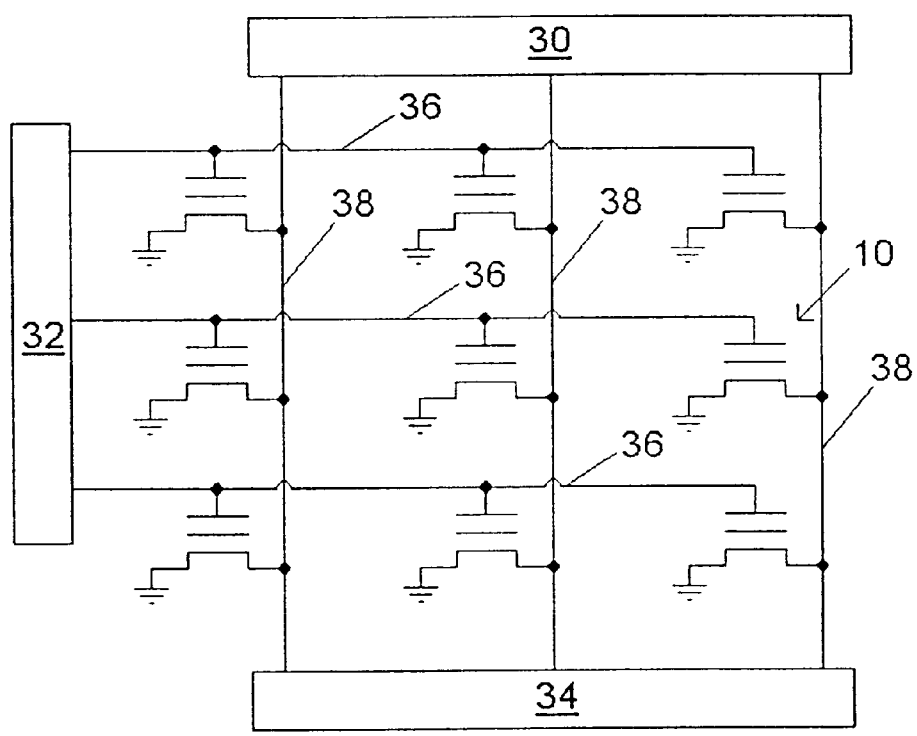
FIG. 2 is a circuit diagram of a plurality of memory cells arranged in a matrix in accordance with one embodiment of the present invention.

Referring to FIG. 2, a circuit diagram of a plurality of memory cells arranged in a matrix in accordance with one embodiment of the present invention is depicted. The electronic circuit can be fabricated as a portion of a larger integrated circuit. The integrated circuit package may be, for example, but not limited to, plastic dual in-line package (PDIP), small outline (SO), shrink small outline package (SSOP), thin shrink small outline package (TSSOP), windowed ceramic dual in-line package (CERDIP), leadless chip carrier (LCC), plastic leaded chip carrier (PLCC), plastic quad flatpack package (PQFP), thin quad flatpack package (TQFP), pin grid array (PGA), ball grid array (BGA), TO-220, T0-247 and T0-263.

The electronic circuit includes an array of non-volatile memory cells 10. By way of example and for ease of illustration, the non-volatile memory array is shown to include nine memory cells. Those of skill in the art are aware that non-volatile memory can be fabricated with a specified number of memory cells. The non-volatile memory array is an EEPROM. In an alternate embodiment, the non-volatile memory array is an EPROM (erasable programmable read-only memory). Other types of non-volatile memory can be used in other embodiments.

A gate bias circuit 32 is coupled to the gates 12 of the cells 10. The gate bias circuit 32 applied a voltage to the gates 12 of all the cells 10 in a row via a row line 36. A column selector 30 is connected to the drains 20 of all the cells 10 via column lines 38. The column lines 38 are also coupled to a detection circuit 34. Each of the gate bias circuit 32, the column selector 38, and the detection circuit 34 receive information specifying a particular cell 10 to be selected. The interception of a row line 36 and column line 38 allow for the voltage state of one cell 10 from the array to be examined.

Figure 3:
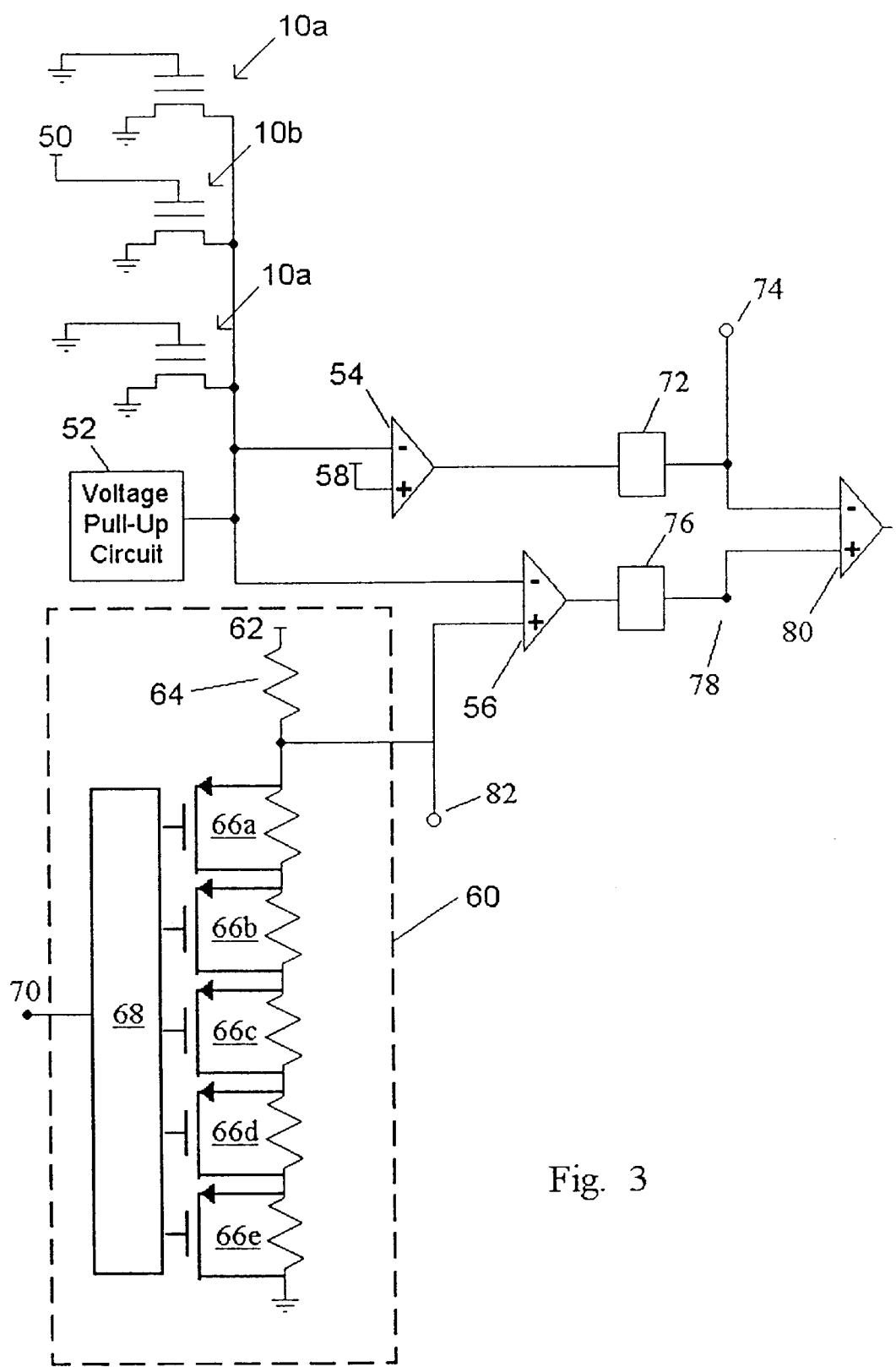
FIG. 3 is a circuit diagram of detection, margin, and monitor circuits in accordance with one embodiment of the present invention.

Referring to FIG. 3, a circuit diagram of detection, margin, and monitor circuits in accordance with one embodiment of the present invention is depicted. The circuitry is all contained in the same integrated circuit as the memory cells. The circuits shown in FIG. 3 are applicable to non-volatile memory cells that support multiple programmed states. A column of cells 10 is connected to a voltage pull-up circuit 52 and two sense comparators 54, 56. The comparators 54, 56 can be sense amplifiers. Two of the cells 10a are in unselected rows. One of the cells 10b is in the selected row and as a result has a read voltage 50 placed on its gate. Depending on the charge present on the floating gate 14 of the selected cell 10b, the drain will either have low resistance or high resistance to the grounded source. If the resistance is high, the voltage pull-up circuit 52, part of the column selector 30, will place a high voltage on the drain and the comparator inputs. If the resistance is low, the ground voltage on the source will pull the drain down to a low voltage. The unselected cells 10a both have high resistance because there is no voltage on their gates.

The first comparator 54 together with a reference voltage 58 and first latch 72 form a detection circuit. Depending on the voltage state of the selected cell 10b, the first comparator 54 outputs a high or low voltage signal that can be stored in the first latch 72. The latch 72 can output its stored state at 74 as a read value for the cell 10b. The second comparator 56, together with a margin voltage circuit 60, and a second latch 76 form a margin circuit. Depending on the voltage state of the selected cell 10b and the margin voltage output by the margin voltage circuit 60, the second comparator 56 outputs a high or low voltage signal that can be stored in the second latch 76.

The margin voltage circuit 60 allows a margin voltage to be selected from a plurality of available voltages. A series of resistors are coupled between ground and a high voltage 62. An unbypassed resistor 64 separates the margin voltage from the high voltage 62. The rest of the series consists of resistors with bypasses 66a–e. A bypass control circuit 68 is coupled to each resistor/bypass pair 66a–e. The control circuit 68 can be programmed to activate certain bypasses, but not others. It is preferable for the resistors 66a–e to be binarily valued (related by power of two) to increase the range of possible resistances and therefore voltages. The control circuit 68 includes an input 70 for programming. In an alternate embodiment of the invention, a single margin voltage is supplied.

The margin voltage circuit 60 can also be configured as a programming circuit to provide a programming voltage at 82 for application to a cell gate 12 to program the cell. For example, the highest possible voltage (achieved by bypassing none of the resistors) can be the programming voltage, while a lower voltage (achieved by bypassing several resistors) can be the margin voltage.

A monitor circuit includes the comparator 80 that is connected to the outputs of the first latch 72 and second latch 76. The monitor circuit determines whether the voltage state of the selected cell 10b fell between the reference voltage 58 and the margin voltage 82 by comparing the output values 74, 78. If the monitor circuit detects that those stored values are different it generates a signal that can be used as a diagnostic signal or to connect the programming voltage 82 (after control circuit 68 modifies the bypass voltages) to the cell in question. In an alternate embodiment, a checksum circuit (well known to those in the art) calculates a checksum for outputs from the detection and margin circuits for a number of cells, even all the cells. Those checksums are then compared and a difference generates a cell-by-cell test (as described above), a diagnostic warning, or reprogramming.

Figure 4:
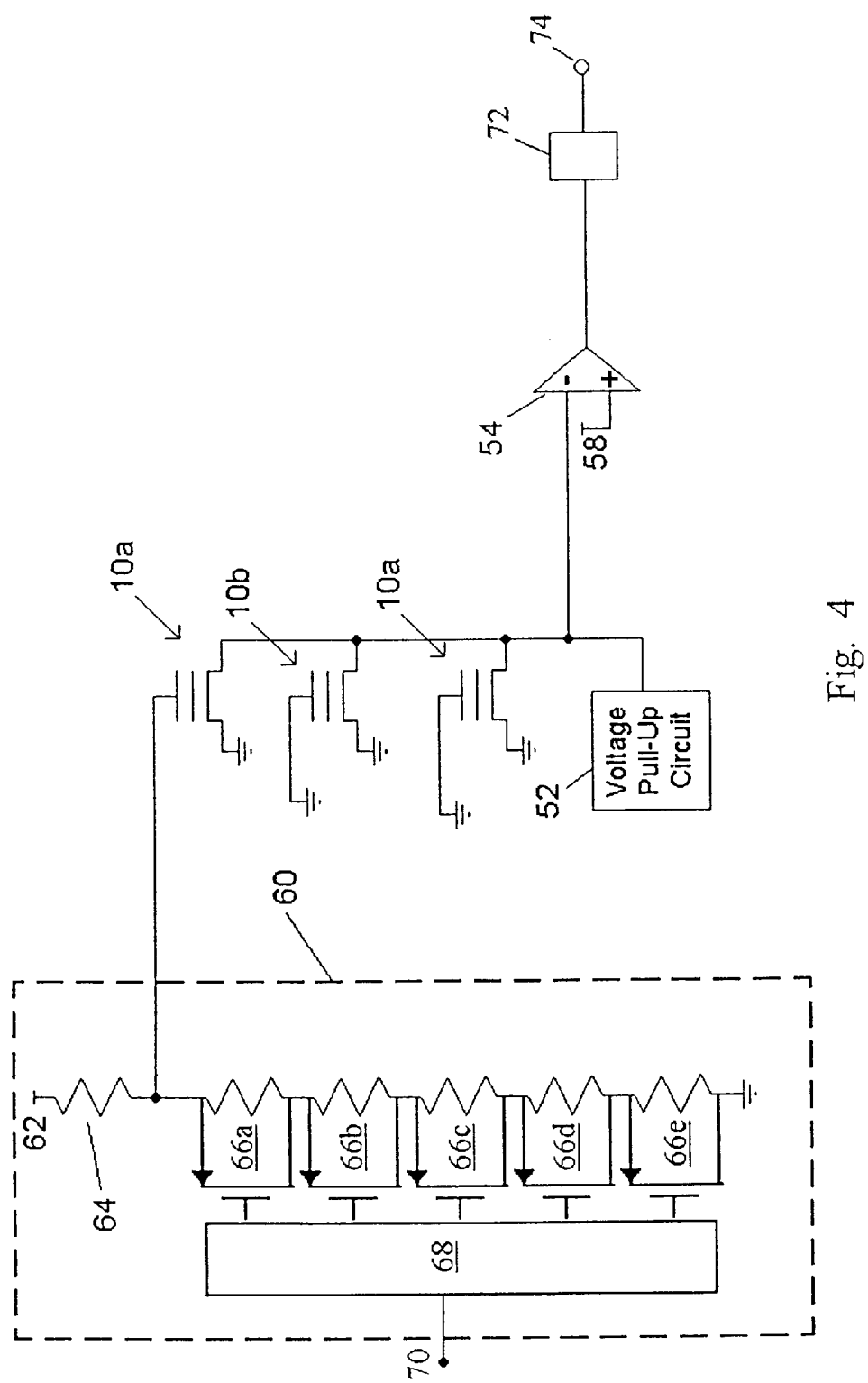
FIG. 4 is a circuit diagram of detection and gate bias circuits in accordance with one embodiment of the present invention.

Referring to FIG. 4, a circuit diagram of detection and gate bias circuits in accordance with one embodiment of the present invention is depicted. The circuitry is all contained in the same integrated circuit as the memory cells. In this circuit, the margin voltage circuit 60 is a gate bias circuit and is connected to the gate 12 of the selected cell 10a. The gate bias circuit controls the resistor/bypasses 66a–e to apply sequential read and margin voltages. In one embodiment the gate bias circuit controls the resistor/bypasses 66a–e to apply sequential read, first margin, and second margin voltages. The first margin voltage can be below the read voltage. The second margin voltage can be above the read voltage. Depending upon the charge contained on the floating gate of the selected cell 10a, the drain voltage will either be high as a result of the voltage pull-up circuit 52 or low as a result of low resistance to the grounded source. The detection circuit including the first comparator 54, a first reference voltage 58, and the first latch 72, produces an output at 74 indicating whether the voltage state of the selected cell 10a is above or below the reference voltage 58. In another embodiment, the detector circuit is a digital circuit element, e.g., an exclusive-or gate, that receives the high or low drain voltage as a digital signal.

A monitor circuit, shown in detail in FIG. 4, receives the output of the detection circuit and determines whether that output changes when a read voltage on the gate 12 of the selected cell 10a is replaced with a margin voltage. In one embodiment, the monitor also determines whether that output changes when a first margin voltage on the gate 12 of the selected cell 10a is replaced with a second margin voltage. The monitor circuit can create a diagnostic signal or reprogram the appropriate cells. The monitor circuit can also reselect margin voltages closer to the read voltage to determine the output change point. In an alternate embodiment, the monitor circuit checks groups of cells using checksums as discussed above with respect to FIG. 4.

Figure 5:
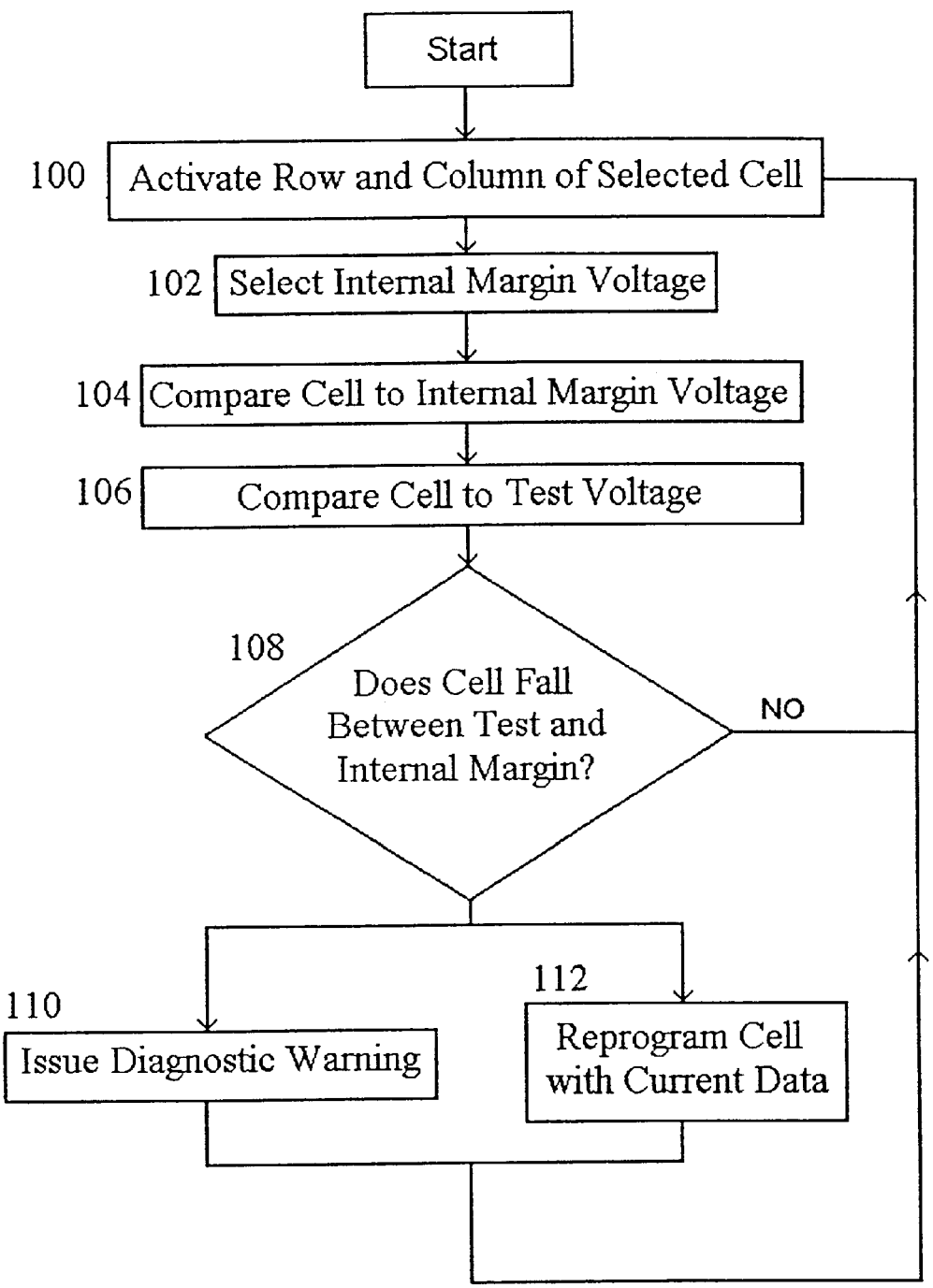
FIG. 5 is a flow diagram of a method for monitoring and refreshing non-volatile memory cells in accordance with one embodiment of the present invention.

Referring to FIG. 5, a flow diagram of a method for monitoring and refreshing non-volatile memory cells in accordance with one embodiment of the present invention is depicted. The method shown in FIG. 5 is applicable to non-volatile memory cells that support multiple programmed states. After the method starts the row and cell of a selected cell are activated 100. An internal margin voltage is then selected 102. The voltage state of the cell is compared to the internal margin voltage 104. The voltage state is also compared to a test or reference voltage 106. A condition is then checked 108. If the voltage state of the cell does not fall between the test voltage and the internal margin voltage, a new cell is selected until the method has finished.

If the voltage state of the cell does fall between the test voltage and the internal margin voltage, the method can do one of two things: it can issue a diagnostic warning 110, or it can reprogram the cell with the current data 112. Once the method has responded to the difference between the comparison with the reference voltage and the internal margin voltage another cell is selected.

Figure 6:
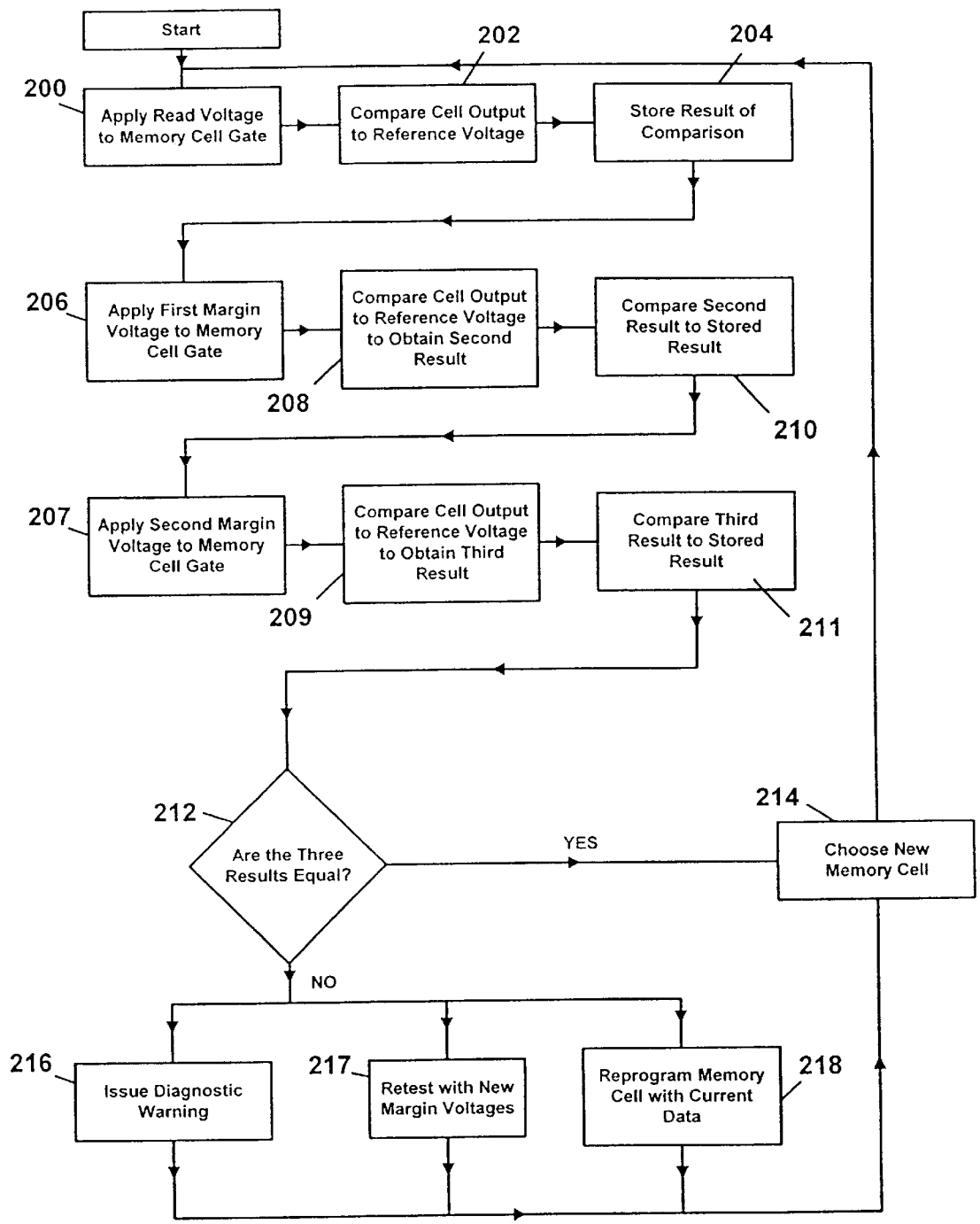
FIG. 6 is a flow diagram of another method for monitoring and refreshing non-volatile memory cells in accordance with one embodiment of the present invention.

Referring to FIG. 6, a flow diagram of another method for monitoring and refreshing non-volatile memory cells in accordance with one embodiment of the present invention is depicted. A read voltage is applied to the gate of a selected memory cell 200. The output of that cell is compared to a reference voltage, while the read voltage is applied 202. The result of that comparison is stored 204. A first margin voltage is then applied to the gate of the selected memory cell 206. The output of that cell is compared to a reference voltage, while the first margin voltage is applied, to obtain a second result 208. The second result is compared to the stored result 210. A second margin voltage is then applied to the gate of the selected memory cell 207. The output of that cell is compared to a reference voltage, while the second margin voltage is applied, to obtain a third result 209. The third result is compared to the stored result 211. Different branches are taken depending upon whether the second and third results are equal to the stored result 212. If they are, a new memory cell is selected and the method restarts 214. If they are not, a diagnostic warning can occur 216, retesting of the cell can occur with new margin voltages 217, or reprogramming can proceed 218. In an alternate embodiment, groups of cells are compared by calculating checksums of results with the read voltage on the gate and the margin voltage on the gate. In one embodiment, the read voltage is between the first and second margin voltages.

The invention, therefore, is well adapted to carry out the objects and attain the ends and advantages mentioned, as well as others inherent therein. While the invention has been depicted and described and is defined by reference to particular embodiments of the invention, such references do not imply a limitation on the invention, and no such limitation is to be inferred. The invention is capable of considerable modification, alternation and equivalents in form and function, as will occur to those ordinarily skilled in the pertinent arts. For example, other methods of comparing multiple cells besides checksums can be used. One such method would be a cyclic redundancy check. The depicted and described embodiments of the invention are exemplary only and are not exhaustive of the scope of the invention. Consequently, the invention is intended to be limited only by the spirit and scope of the appended claims, giving full cognizance to equivalents in all respects.

What is claimed is:

1. An electronic circuit for monitoring and refreshing non-volatile memory, comprising:

a non-volatile memory in an integrated circuit including a first plurality of non-volatile memory cells each having a voltage state and a gate;

a gate bias circuit located in the integrated circuit, coupled to the gates of the first plurality of non-volatile memory cells, including a read voltage and a first margin voltage;

a monitor circuit located in the integrated circuit and coupled to the first plurality of non-volatile memory cells, including a comparison circuit adapted to determine whether the voltage state of at least one non-volatile memory cell of the first plurality of non-volatile memory cells transitions across a reference voltage between the application of the read voltage and the first margin voltage to the gate of that cell; and a programming circuit located in the integrated circuit, including a programming voltage selectively coupled to the first plurality of non-volatile memory cells, wherein the programming voltage is applied to the non-volatile memory cell of the first plurality of non-volatile memory cells in response to the output signal of the monitor circuit indicating that the voltage state of the non-volatile memory cell transitions across the reference voltage between the application of the read voltage and the first margin voltage to the gate of that cell.

2. The circuit of claim 1, wherein the non-volatile memory is programmable.

3. The circuit of claim 1, wherein the non-volatile memory includes a second plurality of nonvolatile memory cells.

4. The circuit of claim 1, wherein:
the gate bias circuit includes a second margin voltage and
the comparison circuit is adapted to determine whether the voltage state of at least one non-volatile memory cell of the first plurality of non-volatile memory cells transitions across the reference voltage during the application of the read voltage, the first margin voltage, and the second margin voltage to the gate of that cell.

5. The circuit of claim 4, wherein:
the first margin voltage is lower than the read voltage and second margin voltage is higher than the read voltage.

6. An electronic circuit for monitoring and refreshing non-volatile memory, comprising:
a non-volatile memory in an integrated circuit including a first plurality of non-volatile memory cells each having a voltage state and a gate;

a gate bias circuit located in the integrated circuit, coupled to the gates of the first plurality of non-volatile memory cells, including a read voltage and a first margin voltage; and a monitor circuit located in the integrated circuit and coupled to the first plurality of non-volatile memory cells, including a comparison circuit adapted to determine whether the voltage state of at least one non-volatile memory cell of the first plurality of non-volatile memory cells transitions across a reference voltage between the application of the read voltage and the first margin voltage to the gate of that cell, wherein the monitor circuit comprises a checksum circuit that is coupled to the output of the detection circuit, the checksum circuit adapted to calculate a first checksum of the first signal for a third plurality of non-volatile memory cells of the first plurality of non-volatile memory cells with the read voltage applied to the gates of those cells and adapted to calculate a second checksum of the first signal for the third plurality of non-volatile memory cells of the first plurality of non-volatile memory cells with the margin voltage applied to the gates of those cells, and wherein the monitor circuit output corresponds to a comparison of the first and second checksums.

7. The circuit of claim 6, wherein the third plurality of non-volatile memory cells includes all the memory cells of the first plurality of non-volatile memory cells.

8. An electronic circuit for monitoring and refreshing non-volatile memory, comprising:
a non-volatile memory in an integrated circuit including a first plurality of non-volatile memory cells each having a voltage state and at least one selection input;

a detection circuit located in the integrated circuit, including a first comparator coupled to the first plurality of non-volatile memory cells and to a reference voltage, the detection circuit having an output capable of generating a first signal indicating whether the reference voltage is greater or lesser than the voltage state of one of the first plurality of non-volatile memory cells;

a margin circuit located in the integrated circuit, including a second comparator coupled to the first plurality of non-volatile memory cells and to a margin voltage, the margin circuit having an output capable of generating a second signal indicating whether the margin voltage is greater or lesser than the voltage state of one of the first plurality of non-volatile memory cells; and a monitor circuit located in the integrated circuit and coupled to the outputs of the detection and margin circuits, including a comparison circuit adapted to determine from the first and second signals whether the voltage state of at least one non-volatile memory cell of the first plurality of non-volatile memory cells is between the reference voltage and the margin voltage, and including an output capable of generating a signal indicating that condition.

9. The circuit of claim 8, wherein the non-volatile memory is programmable.

10. The circuit of claim 8, wherein the non-volatile memory includes a second plurality of nonvolatile memory cells.

11. The circuit of claim 8, further comprising:
a programming circuit located in the integrated circuit, including a programming voltage selectively coupled to the first plurality of non-volatile memory cells, wherein the programming voltage is applied to the non-volatile memory cell of the first plurality of non-volatile memory cells in response to the output signal of the monitor circuit indicating that the voltage state of the non-volatile memory cell is between the reference voltage and the margin voltage.

12. The circuit of claim 8, wherein the monitor circuit comprises a checksum circuit that is coupled to the output of the detection circuit and the margin circuit, the checksum circuit adapted to calculate a first checksum of the first signal for a third plurality of non-volatile memory cells of the first plurality of non-volatile memory cells and adapted to calculate a second checksum of the second signal for the third plurality of non-volatile memory cells of the first plurality of non-volatile memory cells, and wherein the monitor circuit output corresponds to a comparison of the first and second checksums.

13. The circuit of claim 12, wherein the third plurality of non-volatile memory cells includes all the memory cells of the first plurality of non-volatile memory cells.

14. The circuit of claim 8, wherein the first comparator and second comparator are the same structure and the detection circuit and margin circuit are formed dynamically by changing the voltage applied to the comparator.

15. A method for monitoring and refreshing non-volatile memory on an integrated circuit, comprising the steps of:
   (a) applying a read voltage produced on the integrated circuit during normal operation to a gate of a non-volatile memory cell;
   (b) storing a value based on the non-volatile memory cell output while the read voltage is applied to the gate of the non-volatile memory cell to produce a first result;
   (c) applying a first margin voltage produced on the integrated circuit during normal operation to the gate of the non-volatile memory cell;
   (d) storing a value based on the non-volatile memory cell output while the first margin voltage is applied to the gate of the non-volatile memory cell to produce a second result;
   (e) comparing the first result to the second result; and
   (f) generating a signal if the first result is different from the second result.

16. The method of claim 15, further comprising the steps of:
   (g) storing the first result and second result for a plurality of cells;
   (h) calculating a first checksum from the plurality of first results;
   (i) calculating a second checksum from the plurality of second results; and
wherein step (e) comprises comparing the first checksum to the second checksum.

17. The method of claim 15, wherein step (a) occurs subsequent to step (c).

18. The method of claim 15, wherein the non-volatile memory cells are programmable.

19. The method of claim 15, further comprising the step of:
   (g) programming the non-volatile cell when step (f) generates a signal.

20. The method of claim 15, further comprising the step of:
   (g) issuing a diagnostic warning when step (f) generates a signal.

21. The method of claim 15, wherein the margin voltage is one of a plurality of available margin voltages provided on the integrated circuit.

22. The method of claim 15, further comprising the steps of:
   (g) applying a second margin voltage produced on the integrated circuit during normal operation to the gate of the non-volatile memory cell;
   (h) storing a value based on the non-volatile memory cell output while the second margin voltage is applied to the gate of the non-volatile memory cell to produce a third result;
   (i) comparing the third result to the first result; and
   (j) generating a signal if the third result is different from the first result.

23. The method of claim 22, wherein the first margin voltage is less than the read voltage and the second margin voltage is greater than the read voltage.

* * * * *